United States Patent
Prasad et al.

(10) Patent No.: US 11,479,872 B2
(45) Date of Patent: Oct. 25, 2022

(54) ALKALI METAL DOPED BISMUTH VANADATE PHOTOANODE FOR HYDROGEN PRODUCTION BY PHOTOELECTROCHEMICAL WATER SPLITTING

(71) Applicants: Umesh Prasad, Mesa, AZ (US); Jyoti Prakash, Mesa, AZ (US); Arunachala Kannan, Gilbert, AZ (US)

(72) Inventors: Umesh Prasad, Mesa, AZ (US); Jyoti Prakash, Mesa, AZ (US); Arunachala Kannan, Gilbert, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 141 days.

(21) Appl. No.: 16/869,887

(22) Filed: May 8, 2020

(65) Prior Publication Data

US 2020/0354844 A1  Nov. 12, 2020

Related U.S. Application Data

(60) Provisional application No. 62/844,798, filed on May 8, 2019.

(51) Int. Cl.
| | |
|---|---|
| C25B 11/091 | (2021.01) |
| C23C 14/48 | (2006.01) |
| C23C 14/18 | (2006.01) |
| C25B 1/04 | (2021.01) |
| C25B 1/55 | (2021.01) |

(Continued)

(52) U.S. Cl.
CPC ............ *C25B 11/091* (2021.01); *C23C 14/18* (2013.01); *C23C 14/48* (2013.01); *C25B 1/04* (2013.01); *C25B 1/55* (2021.01); *C25B 9/17* (2021.01); *C25B 11/051* (2021.01)

(58) Field of Classification Search
CPC ........... C25B 1/55; C25B 11/091; C25B 1/04; C25B 3/21; C25B 9/50; C25B 11/049; C25B 11/087; C25B 11/051; C25B 9/17; C23C 14/48; C23C 14/18
See application file for complete search history.

(56) References Cited

U.S. PATENT DOCUMENTS

| | | | |
|---|---|---|---|
| 9,856,567 B2 | 1/2018 | Choi et al. | |
| 2010/0108488 A1* | 5/2010 | Chen | B01J 35/004 |
| | | | 977/762 |

(Continued)

OTHER PUBLICATIONS

Jia et al. Facile fabrication of an efficient BiVO4 thin film electrode for water splitting under visible light irradiation. Jul. 17, 2012. PNAS. vol. 101, No. 29, pp. 11564-11569. (Year: 2012).*

(Continued)

*Primary Examiner* — Ciel P Contreras
(74) *Attorney, Agent, or Firm* — Fish & Richardson P.C.

(57) ABSTRACT

Fabricating a doped bismuth vanadate electrode includes spray coating a substrate with an aqueous solution with vanadium-containing anions and bismuth-containing cations to yield a coated substrate, heating the coated substrate to form crystalline bismuth vanadate on the substrate, and doping the crystalline bismuth vanadate with lithium ions to yield a doped bismuth vanadate electrode.

13 Claims, 8 Drawing Sheets

(51) Int. Cl.
C25B 9/17 (2021.01)
C25B 11/051 (2021.01)

(56) References Cited

U.S. PATENT DOCUMENTS

| | | | | |
|---|---|---|---|---|
| 2011/0266136 | A1* | 11/2011 | Varma | B01J 37/031 502/200 |
| 2012/0267234 | A1* | 10/2012 | Reece | C01B 3/042 977/773 |
| 2013/0168228 | A1* | 7/2013 | Ozin | C25B 3/25 977/773 |
| 2014/0179810 | A1* | 6/2014 | Yoon | B01J 19/127 518/711 |
| 2015/0101664 | A1* | 4/2015 | Hu | C25B 11/04 136/256 |
| 2016/0028092 | A1* | 1/2016 | Kudo | B01J 37/346 502/227 |

OTHER PUBLICATIONS

A. Eftekhari, V.J. Babu, S. Ramakrishna, "Photoelectrode nanomaterials for photoelectrochemical water splitting," Int. J. Hydrogen Energy, 42 (2017) 11078-11109, https://doi.org/10.1016/j.ijhydene.2017.03.029.

A. McCabe, D. Pojani, A.B. van Groenou, "The application of renewable energy to social housing: a systematic review," Energy Pol. 114 (2018) 549-557, https://doi.org/10.1016/j.enpol.2017.12.031.

A.G. Lind, H.L. Aldridge, C. Hatem, M.E. Law, K.S. Jones, "Review-dopant selection considerations and equilibrium thermal processing limits for n+-In0.53Ga0.47As," ECS J. Solid State Sci. Technol. 5 (2016) Q125-Q131, https://doi.org/10.1149/2.0201605jss.

Abdi et al., "Efficient BiVO4 Thin Film Photoanodes Modified with Cobalt Phosphate Catalyst and W-Doping," ChemCatChem 2013, 5(2), 490-496. https://doi.org/10.1002/cctc.201200472.

Abdi et al., "Efficient Solar Water Splitting by Enhanced Charge Separation in a Bismuth Vanadate-Silicon Tandem Photoelectrode," Nat. Commun. 2013, 4, 1-7. https://doi.org/10.1038/ncomms3195.

B. Pattengale, J. Ludwig, J. Huang, "Atomic insight into the W-doping effect on carrier dynamics and photoelectrochemical properties of BiVO4 photoanodes," J. Phys. Chem. C 120 (2016) 1421-1427, https://doi.org/10.1021/acs.jpcc.5b11451.

Baek, J. H.; Kim, B. J.; Han, G. S.; Hwang, S. W.; Kim, D. R.; Cho, I. S.; Jung, H. S., "BiVO4/WO3/SnO2double-Heterojunction Photoanode with Enhanced Charge Separation and Visible-Transparency for Bias-Free Solar Water-Splitting with a Perovskite Solar Cell," ACS Appl. Mater. Interfaces 2017, 9 (2), 1479-1487. https://doi.org/10.1021/acsami.6b12782.

Boudries, R., "Techno-Economic Study of Hydrogen Production Using CSP Technology," Int. J. Hydrogen Energy 2018, 43(6), 3406-3417. https://doi.org/10.1016/j.ijhydene.2017.05.157.

Chae, S. Y.; Lee, C. S.; Jung, H.; Joo, O.-S.; Min, B. K.; Kim, J. H.; Hwang, Y. J., "Insight into Charge Separation in WO 3 /BiVO 4 Heterojunction for Solar Water Splitting," ACS Appl. Mater. Interfaces 2017, 9 (23), 19780-19790. https://doi.org/10.1021/acsami.7b02486.

Chen et al., "Accelerating Materials Development for Photoelectrochemical Hydrogen Production: Standards for Methods, Definitions, and Reporting Protocols," J. Mater. Res. 2010, 25(1), 3-16. https://doi.org/10.1557/jmr.2010.0020.

Cho et al., "Metal Doping of BiVO4 by Composite Electrodeposition with Improved Photoelectrochemical Water Oxidation," J. Phys. Chem. C, 2013, 117(44), 23048-23056. https://doi.org/10.1021/jp408619u.

Choi, J.; Sudhagar, P.; Kim, J. H.; Kwon, J.; Kim, J.; Terashima, C.; Fujishima, A.; Song, T.; Paik, U., "WO3/W:BiVO4/BiVO4graded Photoabsorber Electrode for Enhanced Photoelectocatalytic Solar Light Driven Water Oxidation," Phys. Chem. Chem. Phys. 2017, 19 (6), 4648-4655. https://doi.org/10.1039/c6cp08199a.

D. Wang, G. Chang, Y. Zhang, J. Chao, J. Yang, S. Su, L. Wang, C. Fan, L. Wang, "Hierarchical three-dimensional branched hematite nanorod arrays with enhanced mid-visible light absorption for high-efficiency photoelectrochemical water splitting," Nanoscale 8 (2016) 12697-12701, https://doi.org/10.1039/c6nr03855g.

Dincer, I.; Acar, C., "Innovation in Hydrogen Production," Int. J. Hydrogen Energy 2017, 42(22), 14843-14864. https://doi.org/10.1016/j.ijhydene.2017.04.107.

Dotan, H.; Sivula, K.; Grätzel, M.; Rothschild, A.; Warren, S. C., "Probing the Photoelectrochemical Properties of Hematite (α-Fe2O3) Electrodes Using Hydrogen Peroxide as a Hole Scavenger," Energy Environ. Sci. 2011, 4 (3), 958-964, https://doi.org/10.1039/c0ee00570c.

E.Y. Liu, J.E. Thorne, Y. He, D. Wang, "Understanding photocharging effects on bismuth vanadate," ACS Appl. Mater. Interfaces 9 (2017) 22083-22087, https://doi.org/10.1021/acsami.7b06528.

F.F. Abdi, T.J. Savenije, M.M. May, B. Dam, R. Van De Krol, "The origin of slow carrier transport in BiVO4 thin film photoanodes: a time-resolved microwave conductivity study," J. Phys. Chem. Lett. 4 (2013) 2752-2757, https://doi.org/10.1021/jz4013257.

Fan, T.; Chen, C.; Tang, Z., "Hydrothermal Synthesis of Novel BiFeO 3 /BiVO 4 Heterojunctions with Enhanced Photocatalytic Activities under Visible Light Irradiation," RSC Adv. 2016, 6 (12), 9994-10000. https://doi.org/10.1039/C5RA26500B.

Guerin, J.-L.; Gelfi, J.; Boullier, S.; Delverdier, M.; Bellanger, F.-A.; Bertagnoli, S.; Drexler, I.; Sutter, G.; Messud-Petit, F., "Myxoma Virus Leukemia-Associated Protein Is Responsible for Major Histocompatibility Complex Class I and Fas-CD95 Down-Regulation and Defines Scrapins, a New Group of Surface Cellular Receptor Abductor Proteins," J. Virol. 2002, 76 (6), 2912-2923. https://doi.org/10.1002/anie.201306263.

H. Ahmad, S.K. Kamarudin, L.J. Minggu, M. Kassim, "Hydrogen from photocatalytic water splitting process: a review," Renew. Sustain. Energy Rev. 43 (2015) 599-610, https://doi.org/10.1016/j.rser.2014.10.101.

H. Ullah, A.A. Tahir, T.K. Mallick, "Structural and electronic properties of oxygen defective and Se-doped p-type BiVO4(001) thin film for the applications of photocatalysis," Appl. Catal. B Environ. 224 (2018) 895-903, https://doi.org/10.1016/j.apcatb.2017.11.034.

H. Ye, H.S. Park, A.J. Bard, Screening of electrocatalysts for photoelectrochemical water oxidation on W-doped BiVO4 photocatalysts by scanning electrochemical microscopy, J. Phys. Chem. C 115 (2011) 12464-12470, https://doi.org/10.1021/jp200852c.

H.S. Park, K.E. Kweon, H. Ye, E. Paek, G.S. Hwang, A. J. Bard, "Factors in the metal doping of BiVO4 for improved photoelectrocatalytic activity as studied by scanning electrochemical microscopy and first-principles density-functional calculation," J. Phys. Chem. C 115 (2011) 17870-17879, https://doi.org/10.1021/jp204492r.

I. Arto, I. Capell_an-P_erez, R. Lago, G. Bueno, R. Bermejo, "The energy requirements of a developed world," Energy Sustain, Dev. 33 (2016) 1-13, https://doi.org/10.1016/j.esd.2016.04.001.

J. Mohtasham, "Review article-renewable energies," Energy Procedia 74 (2015) 1289-1297, https://doi.org/10.1016/j.egypro.2015.07.774.

J. Quinonero, T. Lana-Villarreal, R. G_omez, "Improving the photoactivity of bismuth vanadate thin film photoanodes through doping and surface modification strategies," Appl. Catal. B Environ. 194 (2016) 141-149, https://doi.org/10.1016/j.apcatb.2016.04.057.

J. Su, Z. Bai, B. Huang, X. Quan, G. Chen, "Unique three dimensional architecture using a metal-free semiconductor cross-linked bismuth vanadate for efficient photoelectrochemical water oxidation," Nanomater, Energy 24 (2016) 148-157, https://doi.org/10.1016/j.nanoen.2016.04.032.

Jeon, T. H.; Choi, W.; Park, H., "Cobalt-Phosphate Complexes Catalyze the Photoelectrochemical Water Oxidation of BiVO4 electrodes," Phys. Chem. Chem. Phys. 2011, 13 (48), 21392-21401. https://doi.org/10.1039/c1cp23135a.

(56) References Cited

OTHER PUBLICATIONS

Jeong, H. W.; Jeon, T. H.; Jang, J. S.; Choi, W.; Park, H., "Strategic Modification of BiVO4 for Improving Photoelectrochemical Water Oxidation Performance," J. Phys. Chem. C 2013, 117 (18), 9104-9112. https://doi.org/10.1021/jp400415m.

Jin, B.; Jung, E.; Ma, M.; Kim, S.; Zhang, K.; Kim, J. Il; Son, Y.; Park, J. H., "Solution-Processed Yolk-Shell-Shaped WO3/BiVO4 Heterojunction Photoelectrode for Efficient Solar Water Splitting," J. Mater. Chem. A 2018, 2585-2592. https://doi.org/10.1039/C7TA08452H.

Joy, J.; Mathew, J.; George, S. C., "Nanomaterials for Photoelectrochemical Water Splitting—Review," Int. J. Hydrogen Energy 2018, 43 (10), 4804-4817. https://doi.org/10.1016/j.ijhydene.2018.01.099.

K. Ding, B. Chen, Z. Fang, Y. Zhang, Z. Chen, "Why the photocatalytic activity of Mo-doped BiVO4 is enhanced: a comprehensive density functional study," Phys. Chem. Chem. Phys. 16 (2014) 13465-13476, https://doi.org/10.1039/c4cp01350f.

Kalanur, S. S.; Yoo, I. H.; Park, J.; Seo, H., "Insights into the Electronic Bands of WO3/BiVO4/TiO2, Revealing High Solar Water Splitting Efficiency," J. Mater. Chem. A 2017, 5 (4), 1455-1461. https://doi.org/10.1039/c6ta07592d.

Kang et al., "Nanodome Structured BiVO4/GaO x N 1—x Photoanode for Solar Water Oxidation," Adv. Mater. Interfaces, 2017, 4:1700323, 8 pages. https://doi.org/10.1002/admi.201700323.

Kim et al., "Simultaneous enhancements in photon absorption and charge transport of bismuth vanadate photoanodes for solar water splitting," Nat. Commun., 2015, 6:1-10, https://doi.org/10.1038/ncomms9769.

L. van Biert, M. Godjevac, K. Visser, P.V. Aravind, "A review of fuel cell systems for maritime applications," J. Power Sources 327 (2016) 345-364, https://doi.org/10.1016/j.jpowsour.2016.07.007.

L. Xia, J. Bai, J. Li, Q. Zeng, X. Li, B. Zhou, "A highly efficient BiVO4/WO3/W heterojunction photoanode for visible-light responsive dual photoelectrode photocatalytic fuel cell," Appl. Catal. B Environ. 183 (2016) 224-230, https://doi.org/10.1016/j.apcatb.2015.10.050.

Lamm et al., "Emerging postsynthetic improvements of BiVO4 photoanodes for solar water splitting," ACS Energy Lett., 2017, 3:112-124.

Li, Q.; Sun, X.; Lozano, K.; Mao, Y., "Dependence of Photoelectrochemical Properties on Geometry Factors of Interconnected "Caterpillar-like" ZnO Networks," Electrochim. Acta 2016, 222, 232-245. https://doi.org/10.1016/j.electacta.2016.10.162.

Lite Zhou et al., "High Light Absorption and Charge Separation Efficiency at Low Applied Voltage from Sb-Doped SnO2/BiVO4 Core/Shell Nanorod-Array Photoanodes," Nano Lett. 2016 (16) 3463-3474, DOI: 10.1021/acs.nanolett.5b05200.

Liu, C.; Su, J.; Guo, L., "Comparison of Sandwich and Fingers-Crossing Type WO3/BiVO4 multilayer Heterojunctions for Photoelectrochemical Water Oxidation," RSC Adv. 2016, 6 (33), 27557-27565. https://doi.org/10.1039/c5ra25601a.

Liu, S.; Lei, Y. J.; Xin, Z. J.; Lu, Y. Bin; Wang, H. Y., "Water Splitting Based on Homogeneous Copper Molecular Catalysts," J. Photochem. Photobiol. A Chem. 2018, 355, 141-151. https://doi.org/10.1016/j.jphotochem.2017.09.060.

M.V. Malashchonak, E.A. Streltsov, D.A. Kuliomin, A.I. Kulak, A.V. Mazanik, "Monoclinic bismuth vanadate band gap determination by photoelectrochemical spectroscopy," Mater. Chem. Phys. 201 (2017) 189-193, https://doi.org/10.1016/j.matchemphys.2017.08.053.

Ma, Y.; Pendlebury, S. R.; Reynal, A.; Le Formal, F.; Durrant, J. R., "Dynamics of Photogenerated Holes in Undoped BiVO4 Photoanodes for Solar Water Oxidation," Chem. Sci. 2014, 5 (8), 2964-2973. https://doi.org/10.1039/C4SC00469H.

Mohan, S.; Mao, Y., "Dependence of (Photo)Electrochemical Properties on Geometry Factors of Hydrothermally Synthesized Delafossite Copper Gallium Oxide CuGaO2 toward Oxygen Evolution Reaction," J. Electrochem, Soc. 2018, 165 (10), H607-H613. https://doi.org/10.1149/2.0291810jes.

O. Zandi, T. W. Hamann, "Determination of photoelectrochemical water oxidation intermediates on haematite electrode surfaces using operando infrared spectroscopy," Nat. Chem. 8 (2016) 778-783, https://doi.org/10.1038/nchem.2557.

Park, Y.; McDonald, K. J.; Choi, K. S., "Progress in Bismuth Vanadate Photoanodes for Use in Solar Water Oxidation," Chem. Soc. Rev., 2013, 42(6): 2321-2337. https://doi.org/10.1039/c2cs35260e.

Pihosh et al., "Photocatalytic generation of hydrogen by core-shell WO3/BiVO4 nanorods with ultimate water splitting efficiency," Scientific Reports., Jun. 2015, 5:11141, 10 pages, DOI: 10.1038/srep11141.

Qiu et al., "Efficient Solar-Driven Water Splitting by Nanocone BiVO4-Perovskite Tandem Cells," Sci. Adv., 2016, 2(6), 9 pages https://doi.org/10.1126/sciadv.1501764.

Rao, P. M.; Cai, L.; Liu, C.; Cho, I. S.; Lee, C. H.; Weisse, J. M.; Yang, P.; Zheng, X., "Simultaneously Efficient Light Absorption and Charge Separation in WO3/BiVO4 Core/Shell Nanowire Photoanode for Photoelectrochemical Water Oxidation," Nano Lett. 2014, 14 (2), 1099-1105. https://doi.org/10.1021/nl500022z.

S. Hernandez, G. Gerardi, K. Bejtka, A. Fina, N. Russo, "Evaluation of the charge transfer kinetics of spin-coated BiVO4 thin films for sun-driven water photoelectrolysis," Appl. Catal. B Environ. 190 (2016) 66-74, https://doi.org/10.1016/j.apcatb.2016.02.059.

S. Zhou, R. Tang, L. Zhang, L. Yin, "Au nanoparticles coupled three-dimensional macroporous BiVO4/SnO2 Inverse opal heterostructure for efficient photoelectrochemical water splitting," Electrochim. Acta 248 (2017) 593-602, https://doi.org/10.1016/j.electacta.2017.07.058.

S.P. Berglund, A.J.E. Rettie, S. Hoang, C.B. Mullins, "Incorporation of Mo and W into nanostructured BiVO4 films for efficient photoelectrochemical water oxidation," Phys. Chem. Chem. Phys. 14 (2012) 7065-7075, https://doi.org/10.1039/c2cp40807d.

Sheikhbahaei, V.; Baniasadi, E.; Naterer, G. F., "Experimental Investigation of Solar Assisted Hydrogen Production from Water and Aluminum," Int. J. Hydrogen Energy 2018, 43 (19), 9181-9191. https://doi.org/10.1016/j.ijhydene.2018.03.196.

Shi et al., "Role of tungsten doping on the surface states in BiVO4 Photoanodes for water oxidation: tuning the electron trapping process," ACS Catal., 2018, 8(4):3331-3342, https://doi.org/10.1021/acscatal.7b04277.

Shi et al., "Efficient Photoelectrochemical Hydrogen Production from Bismuth Vanadate-Decorated Tungsten Trioxide Helix Nanostructures," Nat. Commun. 2014, 5, 1-8. https://doi.org/10.1038/ncomms5775.

Shi, X.; Herraiz-Cardona, I.; Bertoluzzi, L.; Lopez-Varo, P.; Bisquert, J.; Park, J. H.; Gimenez, S., "Understanding the Synergistic Effect of WO3—BiVO4 Heterostructures by Impedance Spectroscopy," Phys. Chem. Chem. Phys. 2016, 18 (13), 9255-9261. https://doi.org/10.1039/C5CP07905E.

Smits, K.; Grigoijeva, L.; Millers, D.; Sarakovskis, A.; Grabis, J.; Lojkowski, W., "Intrinsic Defect Related Luminescence in ZrO2," J. Lumin. 2011, 131 (10), 2058-2062. https://doi.org/10.1016/j.jlumin.2011.05.018.

Su, J.; Guo, L.; Bao, N.; Grimes, C. A., "Nanostructured WO3/BiVO4 Heterojunction Films for Efficient Photoelectrochemical Water Splitting," Nano Lett. 2011, 11 (5), 1928-1933. https://doi.org/10.1021/nl2000743.

T. Reier, M. Oezaslan, P. Strasser, "Electrocatalytic oxygen evolution reaction (OER) on Ru, Ir, and Pt catalysts: a comparative study of nanoparticles and bulk materials," ACS Catal. 2 (2012) 1765-1772, https://doi.org/10.1021/cs3003098.

Tolod, K.; Hernández, S.; Russo, N., "Recent Advances in the BiVO4 Photocatalyst for Sun-Driven Water Oxidation: Top-Performing Photoanodes and Scale-Up Challenges," Catalysts 2017, 7 (1), 13. 23 pages https://doi.org/10.3390/catal7010013.

Trasatti et al., "Real Surface Area Measurements in Electrochemistry," J. Electroanal. Chem, 1992, 327: 353-376.

Ullah, H.; Tahir, A. A.; Bibi, S.; Mallick, T. K.; Karazhanov, S. Z., "Electronic Properties of β-TaON and Its Surfaces for Solar Water

(56) References Cited

OTHER PUBLICATIONS

Splitting," Appl. Catal. B Environ. 2018, 229 (January), 24-31. https://doi.org/10.1016/j.apcatb.2018.02.001.

Prasad et al., "Stoichiometric and Non-Stoichiometric Tungsten Doping Effect in Bismuth Vanadate Based Photoactive Material for Photoelectrochemical Water Splitting," Electrochim. Acta 2019, 299:262-2727.

V. Jovic, A.J.E. Rettie, V.R. Singh, J. Zhou, B. Lamoureux, C. Buddie Mullins, H. Bluhm, J. Laverock, K.E. Smith, "A soft X-ray spectroscopic perspective of electron localization and transport in tungsten doped bismuth vanadate single crystals," Phys. Chem. Chem. Phys. 18 (2016) 31958-31965, https://doi.org/10.1039/C6CP04526J.

W.J. Jo, J.-W. Jang, K. Kong, H.J. Kang, J.Y. Kim, H. Jun, K.P.S. Parmar, J.S. Lee, "Phosphate doping into monoclinic BiVO4 for enhanced photoelectrochemical water oxidation activity," Angew. Chem. Int. Ed. 51 (2012) 3147-3151, https://doi.org/10.1002/anie.201108276.

W.S. dos Santos, M. Rodriguez, J.M.O. Khoury, L.A. Nascimento, R.J.P. Ribeiro, J.P. Mesquita, A.C. Silva, F.G.E. Nogueira, M.C. Pereira, "Bismuth vanadate photoelectrodes with high photovoltage as photoanode and photocathode in photoelectrochemical cells for water splitting," ChemSusChem 11 (2018) 589-597, https://doi.org/10.1002/cssc.201701929.

Wei, L.; Lozano, K.; Mao, Y., "Microwave Popped Co(II)-Graphene Oxide Hybrid: Bifunctional Catalyst for Hydrogen Evolution Reaction and Hydrogen Storage," Eng. Sci. 2018, 3:62-66. https://doi.org/10.30919/es8d723.

X. Meng, Z. Zhang, "Bismuth-based photocatalytic semiconductors: introduction, challenges and possible approaches," J. Mol. Catal. Chem. 423 (2016) 533-549, https://doi.org/10.1016/j.molcata.2016.07.030.

X. Wan, F. Niu, J. Su, L. Guo, "Enhanced photoelectrochemical water oxidation of bismuth vanadate via a combined strategy of W doping and surface RGO modification," Phys. Chem. Chem. Phys. 18 (2016) 31803-31810, https://doi.org/10.1039/C6CP06233D.

X. Zhang, W. Gao, X. Su, F. Wang, B. Liu, J. J. Wang, H. Liu, Y. Sang, "Conversion of solar power to chemical energy based on carbon nanoparticle modified photothermoelectric generator and electrochemical water splitting system," Nanomater. Energy 48 (2018) 481-488, https://doi.org/10.1016/j.nanoen.2018.03.055.

Xie, M.; Dunn, S.; Boulbar, E. Le; Bowen, C. R., "Pyroelectric Energy Harvesting for Water Splitting," Int. J. Hydrogen Energy 2017, 42 (37), 23437-23445. https://doi.org/10.1016/j.ijhydene.2017.02.086.

Y. Gao, T. W. Hamann, "Elucidation of CuWO4 surface states during photoelectrochemical water oxidation," J, Phys. Chem. Lett. 8 (2017) 2700-2704, https://doi.org/10.1021/acs.jpclett.7b00664.

Y. Ma, C.A. Mesa, E. Pastor, A. Kafizas, L. Franc_as, F. Le Formal, S.R. Pendlebury, J.R. Durrant, "Rate law analysis of water oxidation and hole scavenging on a BiVO4 photoanode," ACS Energy Lett. 1 (2016) 618-623, https://doi.org/10.1021/acsenergylett.6b00263.

Yang, L.; Xiong, Y.; Guo, W.; Guo, J.; Gao, D.; Zhang, Y.; Xiao, P., "Mo6+ Doped BiVO4 with Improved Charge Separation and Oxidation Kinetics for Photoelectrochemical Water Splitting," Electrochim, Acta 2017, 256, 268-277. https://doi.org/10.1016/j.electacta.2017.09.186.

Zhang, T.; Su, J.; Guo, L., "Morphology Engineering of WO3/BiVO4 Heterojunctions for Efficient Photocatalytic Water Oxidation," CrystEngComm 2016, 18 (46), 8961-8970. https://doi.org/10.1039/C6CE01952H.

Zhao, X.; Chen, Z., "Enhanced Photoelectrochemical Water Splitting Performance Using Morphology-Controlled BiVO4 with W Doping," Beilstein J. Nanotechnol. 2017, 8, 2640-2647. https://doi.org/10.3762/bjnano.8.264.

Zhao, X.; Hu, J.; Chen, S.; Chen, Z., "An investigation on the role of W Doping in BiVO4 Photoanode for Solar Water Splitting," Phys. Chem. Chem. Phys. 2018, 19-21. https://doi.org/10.1039/C8CP01316K.

Zheng, X.; Ma, H.; Yang, H., "The Effect of CycA Overexpression on Hydrogen Production Performance of Rhodobacter Sphaeroides HY01," Int. J. Hydrogen Energy 2018, 3, 0-9. 10 pages https://doi.org/10.1016/j.ijhydene.2018.02.017.

Zhong, D. K.; Choi, S.; Gamelin, D. R., "Near-Complete Suppression of Surface Recombination in Solar Photoelectrolysis by "Co-Pi" Catalyst-Modified W:BiVO4," J. Am Chem. Soc. 2011, 133 (45), 18370-18377. https://doi.org/10.1021/ja207348x.

Zhou et al., "Highly Efficient Photoelectrochemical Water Splitting from Hierarchical WO3/BiVO4 Nanoporous Sphere Arrays," Nano Lett. 2017, 17 (12), 8012-8017. https://doi.org/10.1021/acs.nanolett.7b04626.

\* cited by examiner

ABSTRACT# ALKALI METAL DOPED BISMUTH VANADATE PHOTOANODE FOR HYDROGEN PRODUCTION BY PHOTOELECTROCHEMICAL WATER SPLITTING

CROSS-REFERENCE TO RELATED APPLICATION

This application claims the benefit of U.S. Patent Application No. 62/844,798 filed on May 8, 2019, which is incorporated herein by reference in its entirety.

TECHNICAL FIELD

This invention relates to alkali metal doped bismuth vanadate for hydrogen production by photoelectrochemical water oxidation.

BACKGROUND

Bismuth vanadate is one of the most prominent materials explored for photo electrochemical water splitting. However, the photoelectrochemical performance of bismuth vanadate is limited due to relatively poor charge separation and transfer from electrodes.

SUMMARY

This disclosure relates to design, synthesis, and fabrication of alkali (e.g., lithium) doped bismuth vanadate photoanodes. As described herein, suppression of the electron hole-pair recombination along with light absorption enhancement are achieved by placement of alkali metal in the interstitial void of bismuth vanadate crystal lattice. Ultrasonic spray coated electrodes show a photocurrent density of 7.4±0.35 mA·cm$^{-2}$ at 1.23 V vs RHE under 1 sun illumination. The corresponding solar to hydrogen conversion efficiency is ~10.2% and the hydrogen production rate is 0.6 L/min/m$^2$. Results show 100% charge carrier generation and separation efficiency, under visible light illumination, for a photocatalytic water-splitting based hydrogen production process. This result was accomplished by utilization of nanoparticle-based photocatalysts, including lithium doped bismuth vanadate operating as a medium for charge pair generation and separation, and photocurrent density was achieved (i.e., 8.0±0.35 mA·cm$^{-2}$ at 1.23 V vs RHE, corresponding calculated solar to hydrogen conversion efficiency of 10.2% and hydrogen production rate 0.07 gm/min/m$^2$ (0.6 L/min/m$^2$)).

In a first general aspect, fabricating a doped bismuth vanadate electrode includes spray coating a substrate with an aqueous solution having vanadium-containing anions and bismuth-containing cations to yield a coated substrate, heating the coated substrate to form crystalline bismuth vanadate on the substrate, and doping the crystalline bismuth vanadate with lithium ions to yield a doped bismuth vanadate electrode.

Implementations of the first general aspect may include one or more of the following features.

The aqueous solution includes nitrate or hydroxide in a concentration of 2 to 5 mM. The vanadium-containing anions include metavanadate. The bismuth-containing cations can be bismuth cations.

Heating the coated substrate may include heating the coated substrate in air. In some cases, heating the coated substrate includes calcining the coated substrate. Doping the crystalline bismuth vanadate may include contacting the crystalline bismuth vanadate with a vapor including lithium ions. The vapor may include a vapor formed from a lithium precursor solution comprising nitrate or hydroxide.

In some cases, the lithium doped bismuth vanadate electrode has a planar morphology. The lithium doped bismuth vanadate electrode may include 3 to 5 atomic wt. % lithium.

A second general aspect includes a lithium-doped bismuth vanadate electrode formed by the first general aspect.

Implementations of the second general aspect may include one or more of the following features.

The electrode has a charge separation efficiency of about 100%. The electrode has a photocurrent density of about 8 mA·cm$^{-2}$ at zero bias potential under 1 sun illumination. The electrode has a solar to hydrogen conversion efficiency of about 10% with a hydrogen production rate of about 0.6 L/min/m$^2$.

In a third general aspect, a photoelectrochemical cell includes the lithium doped bismuth vanadate electrode of the second general aspect.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

Bismuth vanadate (BiVO$_4$) is one of the most prominent materials explored for photo electrochemical (PEC) water splitting. However, the PEC performance of bismuth vanadate has been limited due to relatively poor charge separation and transfer from electrodes. As described herein, suppression (e.g., complete suppression) of the electron hole-pair recombination along with light absorption expansion are achieved in bulk bismuth vanadate by alkali metal doping. In particular, Li treatment described herein is shown to result in 100% charge separation efficiency at 1.23 V vs reversible hydrogen electrode (RHE) bias potential. The Li:BiVO$_4$ electrodes fabricated by ultrasonic spray coating showed photocurrent density of 8.0±0.35 mA·cm$^{-2}$ at 1.23 V vs RHE under 1 sun illumination in potassium phosphate with sodium sulfite electrolyte. By combining Li doping with oxygen evolution catalyst coating, the performance of BiVO$_4$ electrodes approaches the theoretical limit. Li doping results in enhanced electrochemically active surface area with reduced bulk resistance and perfect or essentially perfect charge separation efficiency. The Li:BiVO$_4$ electrodes show exceptional performance stability at 1 sun, and the facile process can be economically scaled-up for commercialization.

Figure 1:
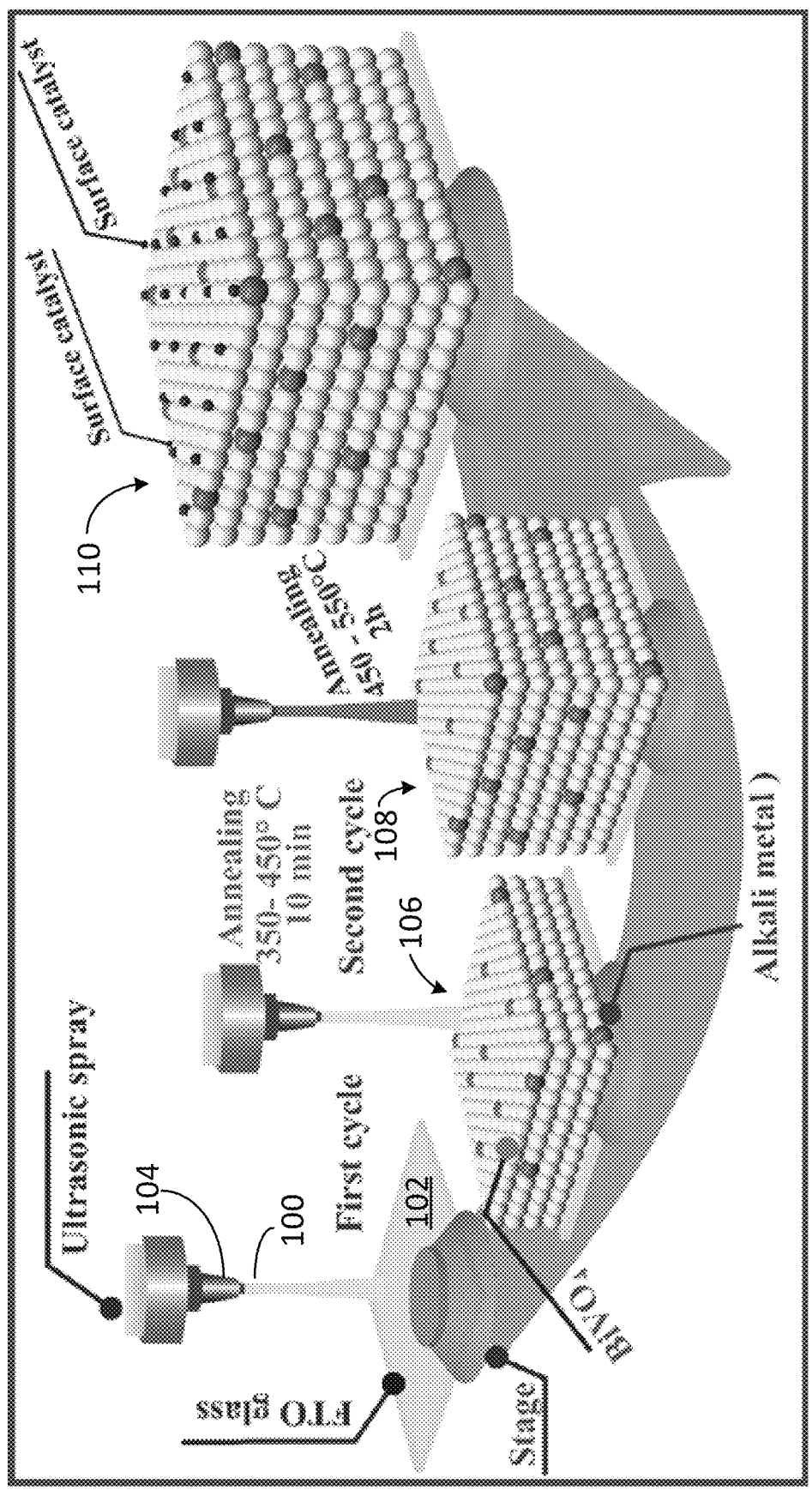
FIG. 1 depicts fabrication of alkali metal doped bismuth vanadate photoanodes.

Fabrication of alkali metal doped BiVO$_4$ electrodes by ultrasonic spray coating is depicted in FIG. 1. The photoactive materials can be synthesized using any precursor solution (2 to 5 mM) containing a 1:1 molar ratio of vanadium and bismuth nitrates in dilute nitric acid solution. This solution 100 is sprayed on a conducting substrate 102 (e.g., fluorine-doped tin oxide (FTO) or indium-doped tin oxide (ITO) coated glass or silicon) with a spray coater 104 (e.g., SonoTek Ultrasonic Exactacoat system), to yield coated substrate 106 in the form of a uniform active material film. The coated substrate 106 is heat treated in air to form crystalline bismuth vanadate 108. The crystalline bismuth vanadate is doped (3 to 5 atomic wt. %) with alkali metal using precursor solution (0.5 to 1 M) of nitrate or hydroxide to yield doped crystalline bismuth vanadate 110.

The characteristics of doped and pristine materials formed as described with respect to FIG. 1 were determined using X-ray powder diffraction (XRD), X-ray photoelectron spectroscopy (XPS), Raman spectroscopy, scanning electron microscopy with energy dispersive X-ray spectroscopy (SEM-EDX), inductively coupled plasma-mass spectrometry (ICPMS), ultraviolet-visible (UV-Vis) spectroscopy, incident photon-to-current efficiency (IPCE), electrochemical techniques, and theoretical analysis using Ab initio calculations.

Photoanodes prepared as described with respect to FIG. 1 were evaluated towards water splitting in potassium phosphate electrolyte in the presence of hole scavengers using a solar simulator (calibrated to 1 sun; 100 mW·cm$^{-2}$) at various biased voltage values. In addition, the electrochemical impedance as well as electrochemically active surface area were also measured for all samples.

Figure 2:
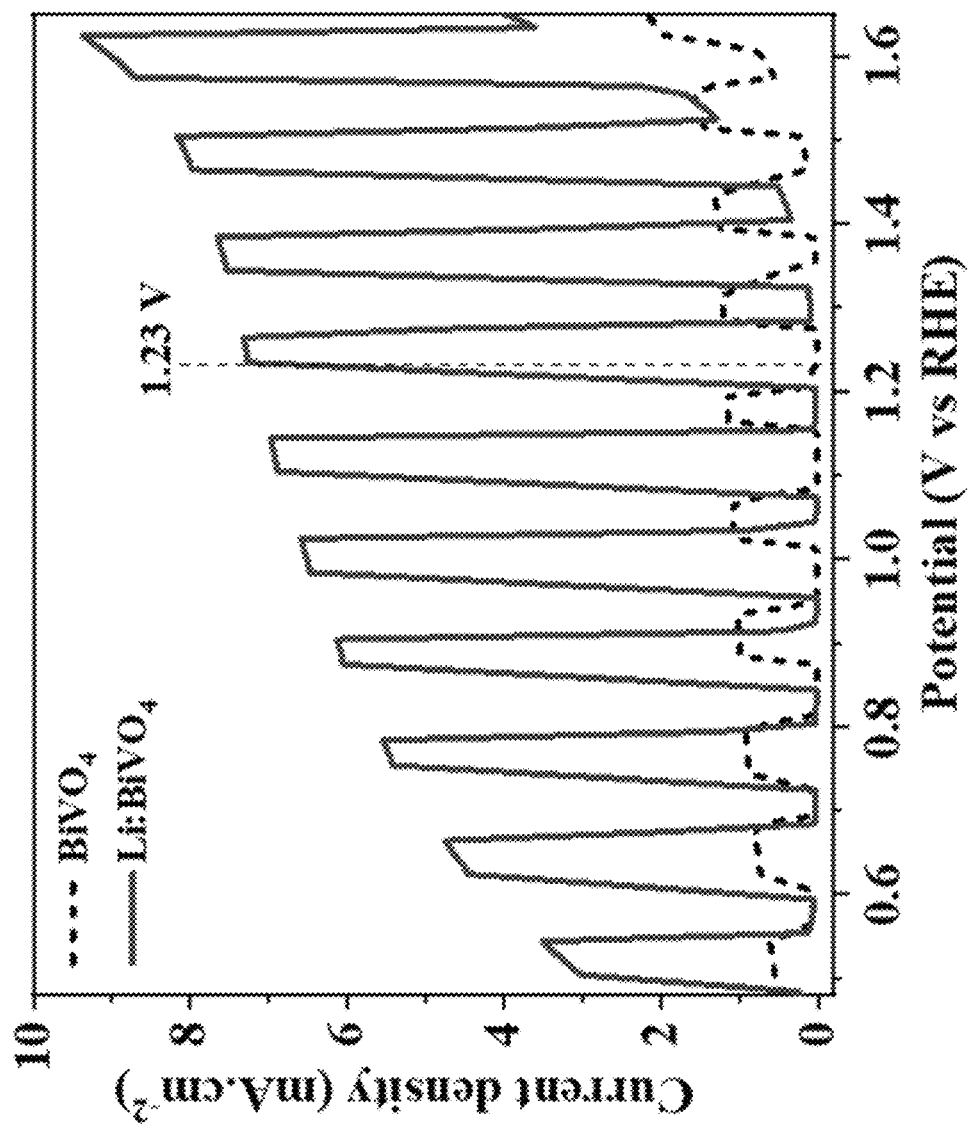
FIG. 2 shows photoelectrochemical performance of doped and pristine bismuth vanadate based photoanodes under 1 sun at 20 mV·s$^{-1}$.
Figure 3:
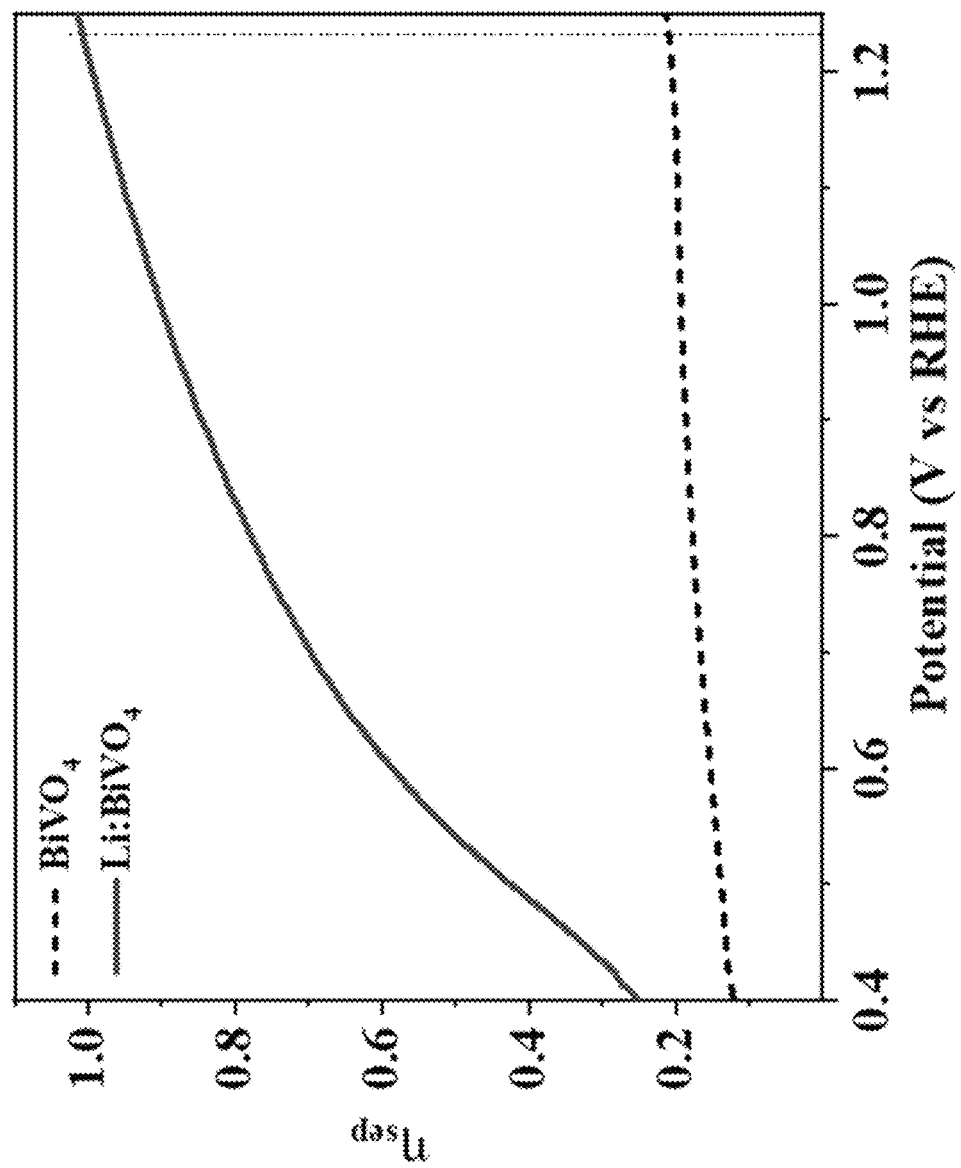
FIG. 3 shows charge separation efficiency for doped and pristine bismuth vanadate based photoanodes.

As shown in FIG. 2, lithium doping at the interstitial positions in the BiVO$_4$ lattice with enhanced light absorption lead to a photocurrent density of 8.0±0.35 mA·cm$^{-2}$ at 1.23 V RHE, under 1 sun illumination. FIG. 3 shows charge separation versus potential for doped and pristine BiVO$_4$ photoanodes. The electrodes showed almost perfect charge separation efficiency (~100%), with achievement of theoretical water splitting performance. Charge separation efficiency accounts for the efficiency of separation of the resulting photo-excited electrons and holes and their transport to the current collector and electrolyte, respectively, and is decreased by bulk recombination in the semiconductor and at internal interfaces. Charge transfer efficiency accounts for the efficiency of charge transfer at the semiconductor/electrolyte interface and is decreased by surface recombination of holes.

Figure 4:
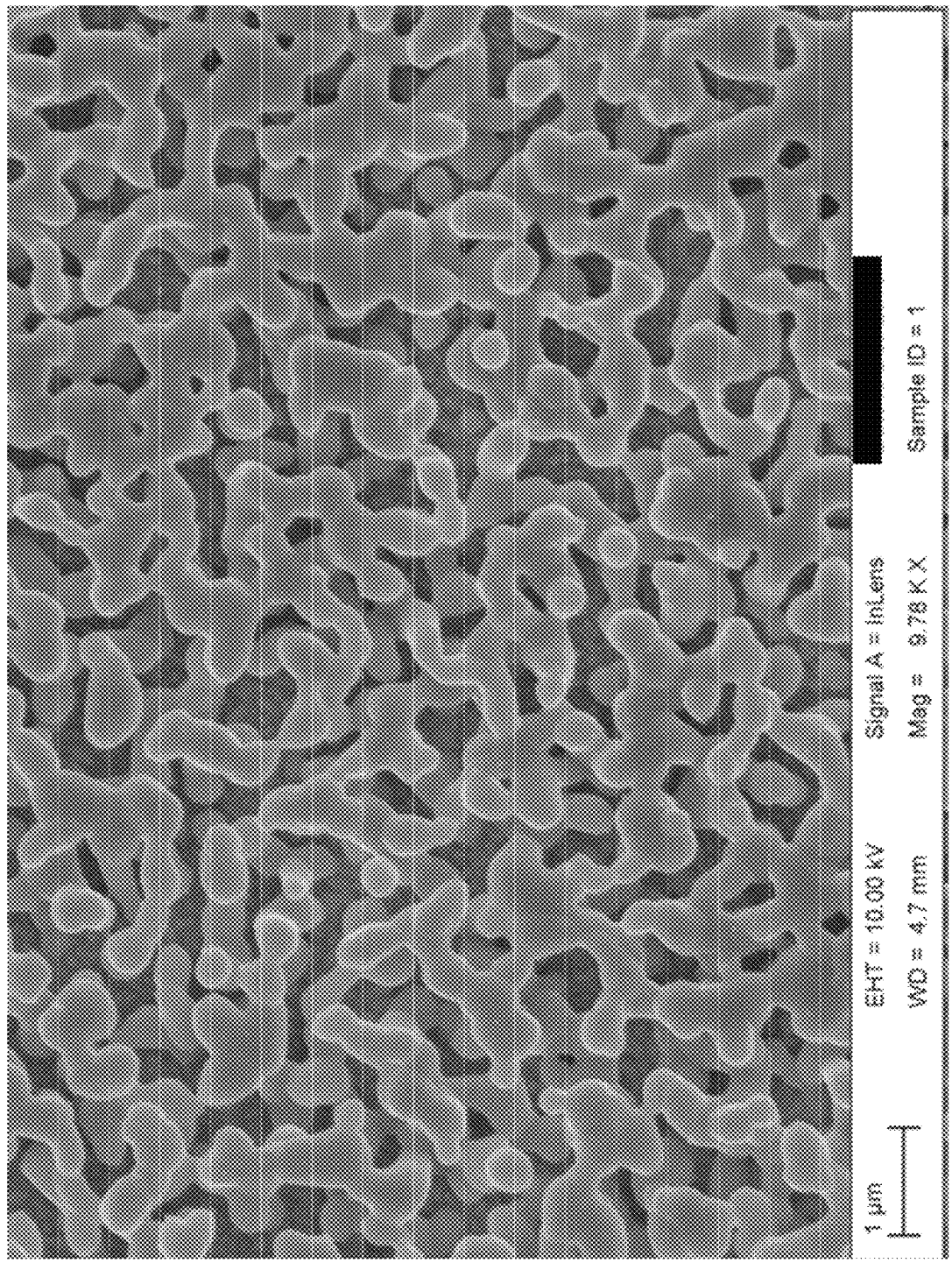
FIG. 4 shows a scanning electron micrograph of a doped bismuth vanadate electrode.

The morphology of the electrodes fabricated as described with respect to FIG. 1 is to be superior in terms of highly homogenous integral network of nanostructure and porous film (FIG. 4).

Figure 5:
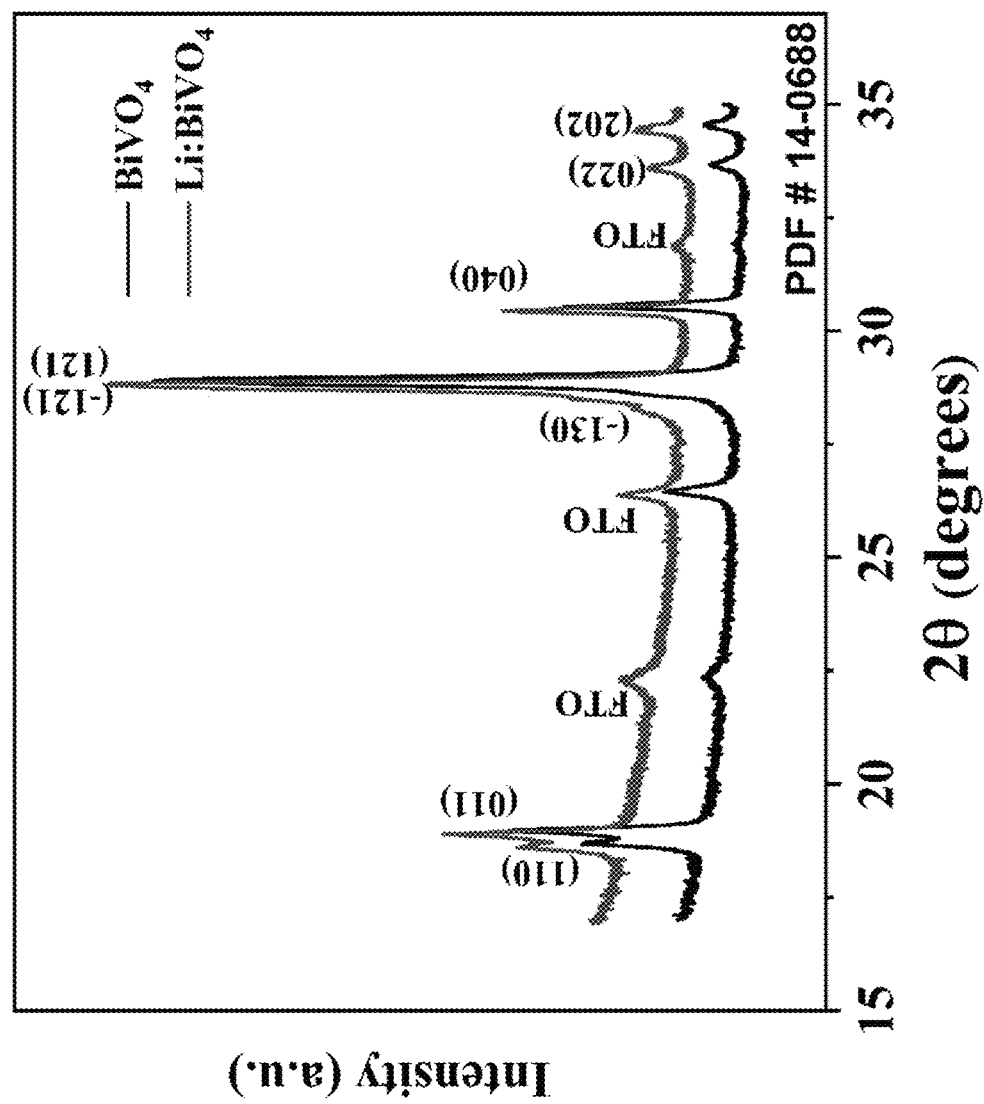
FIG. 5 shows X-ray diffraction patterns for doped and pristine bismuth vanadate based photoanodes.
Figure 6:
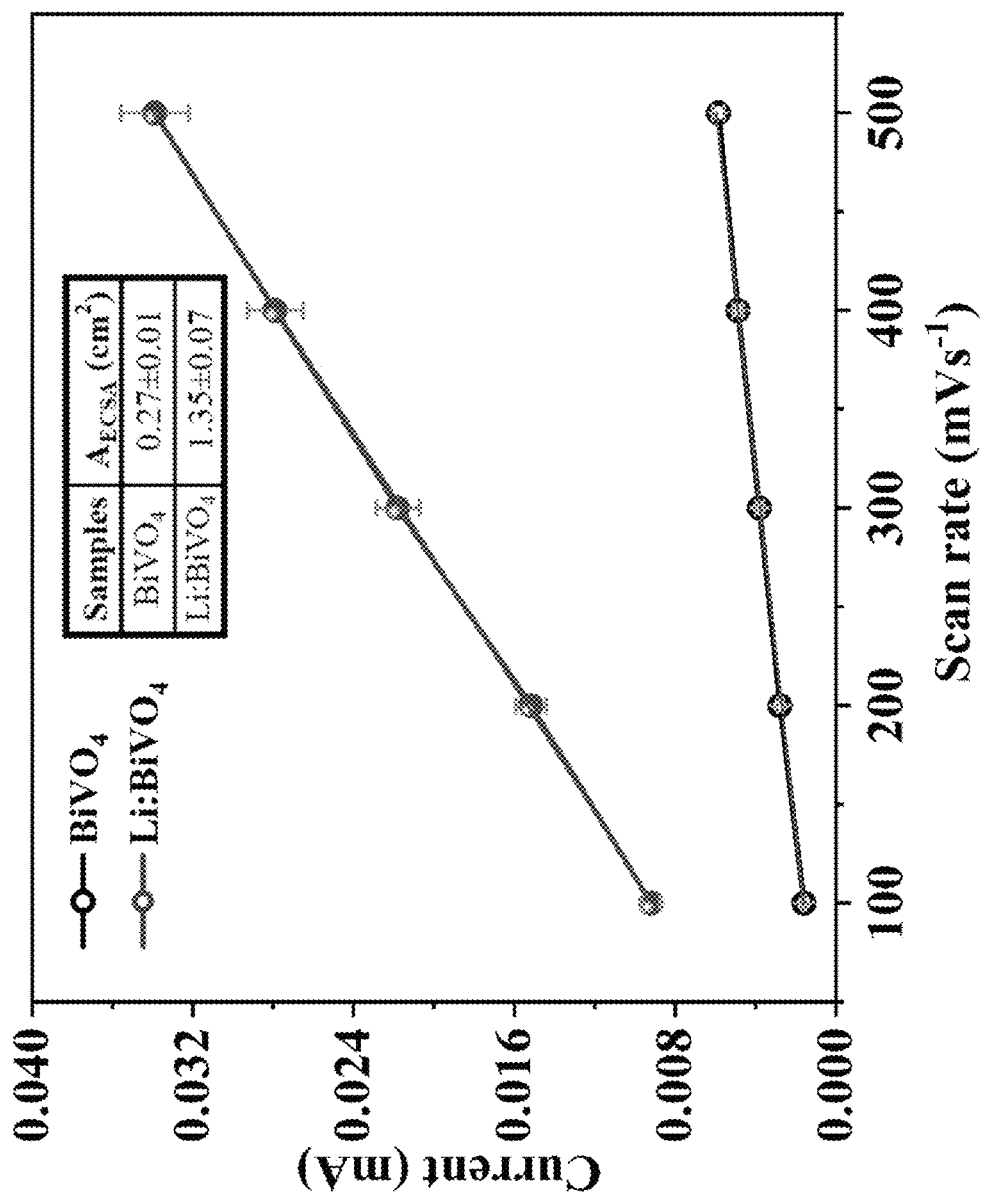
FIG. 6 shows current versus scan rate for doped and pristine bismuth vanadate based photoanodes for estimating electrochemically active surface area.
Figure 7:
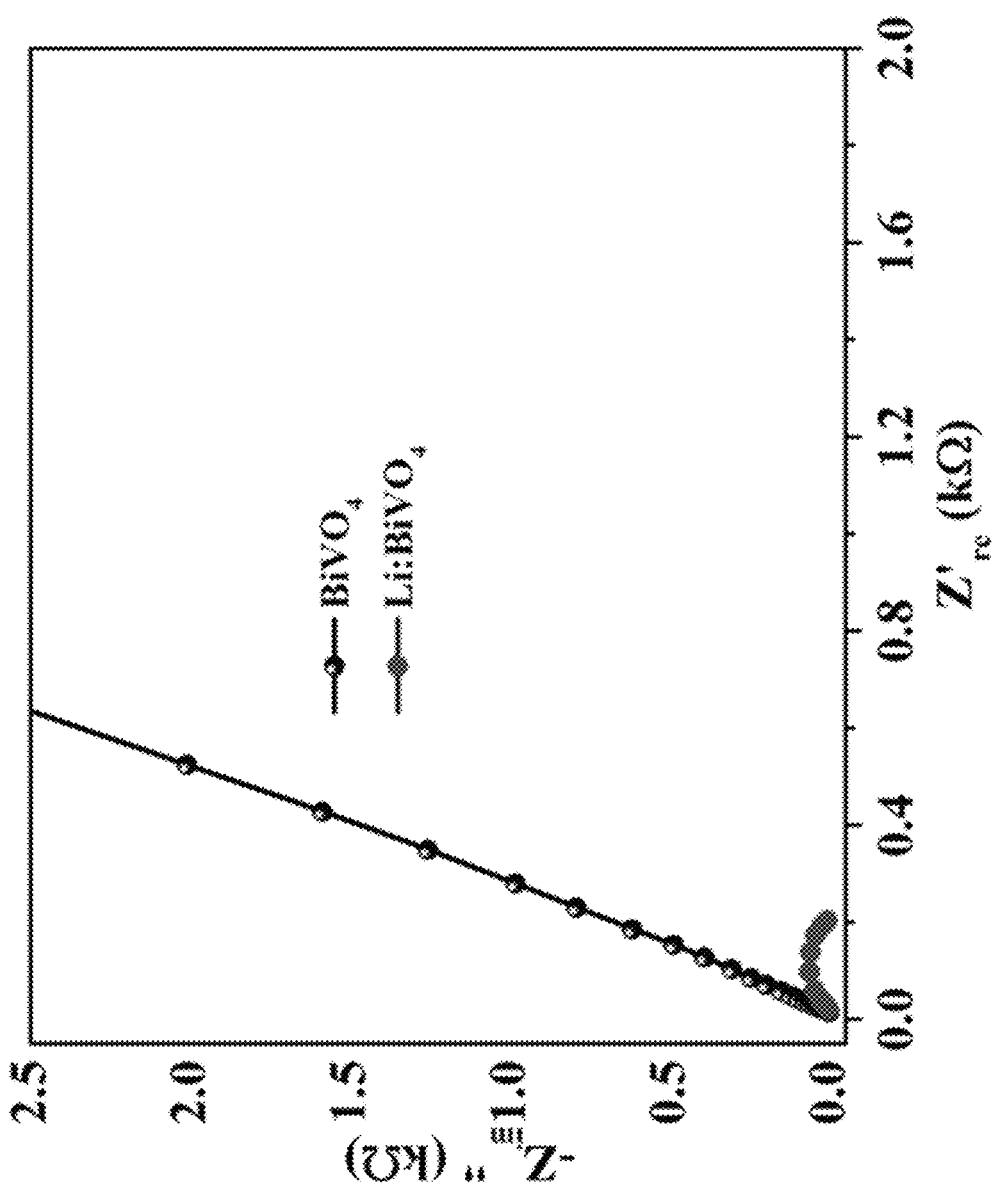
FIG. 7 shows Nyquist plots for doped and pristine bismuth vanadate based photoanodes.

FIG. 5 shows X-ray diffraction patterns for doped and pristine BiVO$_4$ based photoanodes. FIG. 6 shows current versus scan rate for doped and pristine bismuth vanadate based photoanodes for estimating electrochemically active surface area. FIG. 7 shows Nyquist plots for doped and pristine BiVO$_4$ based photoanodes at 1.23 V versus reversible hydrogen electrode (RHE) under 1 sun illumination (frequency range: 100 mHz to 100 kHz, amplitude: 20 mV).

Figure 8:
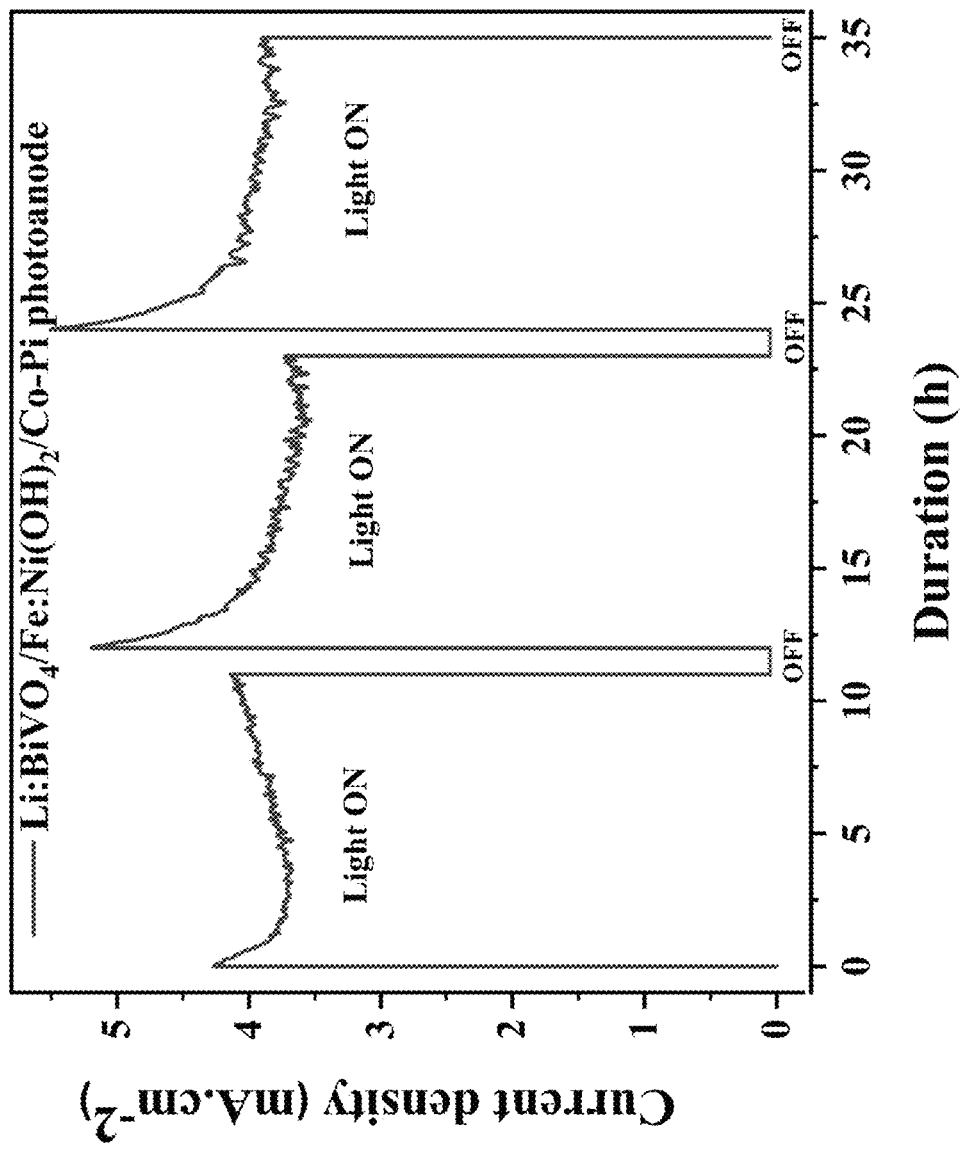
FIG. 8 shows durability results for doped bismuth vanadate.

FIG. 8 shows the performance stability of the Li:BiVO$_4$/Fe:Ni(OH)$_2$/Co—Pi photoanode for water oxidation at 1.23 V vs RHE evaluated with light ON (11 h) and OFF (2 h) for three cycles up to total 33 h.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A method of fabricating an electrode, the method comprising:
   spray coating a substrate with an aqueous solution comprising vanadium-containing anions and bismuth-containing cations to yield a coated substrate, wherein the aqueous solution comprises nitrate or hydroxide in a concentration of 2 to 5 mM;
   heating the coated substrate to form crystalline bismuth vanadate on the substrate, wherein heating the coated substrate comprises annealing the coated substrate at a temperature of 350° C. to 450° C. for 10 minutes;
   doping the crystalline bismuth vanadate with lithium ions to yield a lithium doped crystalline bismuth vanadate precursor electrode; and
   heating the lithium doped crystalline bismuth vanadate precursor electrode to yield a lithium doped bismuth vanadate electrode, wherein the lithium doped bismuth vanadate electrode comprises 3 to 5 atomic wt. % lithium.

2. The method of claim 1, wherein the vanadium-containing anions comprise metavanadate.

3. The method of claim 1, wherein the bismuth-containing cations are bismuth cations.

4. The method of claim 1, wherein the heating the coated substrate comprises heating the coated substrate in air.

5. The method of claim 1, wherein the heating the coated substrate comprises calcining the coated substrate.

6. The method of claim 1, wherein the doping the crystalline bismuth vanadate comprises contacting the crystalline bismuth vanadate with a vapor comprising lithium ions.

7. The method of claim 6, wherein the vapor comprises a vapor formed from a lithium precursor solution comprising nitrate or hydroxide.

8. The method of claim 6, wherein the lithium doped bismuth vanadate electrode has a planar morphology.

9. The method of claim 1, wherein the heating the lithium doped bismuth vanadate precursor electrode comprises annealing the lithium doped crystalline bismuth vanadate precursor electrode at a temperature of 450° C. to 550° C. for a length of time.

10. The method of claim 9, wherein the length of time is 2 hours.

11. The method of claim 1, wherein the aqueous solution comprises a 1:1 molar ratio of vanadium and bismuth nitrates in nitric acid.

12. The method of claim 7, wherein the lithium precursor solution comprises 0.5M to 1M of the nitrate or the hydroxide.

13. The method of claim 1, wherein the spray coating comprises ultrasonic spray coating.

\* \* \* \* \*